United States Patent

[11] 3,612,912

[72] Inventor John B. Schwartz Abington, Pa.
[21] Appl. No. 2,701
[22] Filed Jan. 14, 1970
[45] Patented Oct. 12, 1971
[73] Assignee Sperry Rand Corporation New York, N.Y.

[54] SCHMITT TRIGGER CIRCUIT WITH SELF-REGULATED ARM VOLTAGE

6 Claims, 3 Drawing Figs.

[52] U.S. Cl. .......... 307/290, 307/235
[51] Int. Cl. .......... H03k 5/20, H03k 3/26
[50] Field of Search .......... 307/235, 237, 290; 328/206

[56] References Cited

UNITED STATES PATENTS

| | | | |
|---|---|---|---|
| 3,294,981 | 12/1966 | Bose | 307/290 X |
| 3,381,141 | 4/1968 | Millon | 307/290 X |

*Primary Examiner*—Donald D. Forrer
*Assistant Examiner*—John Zazworsky
*Attorneys*—Charles C. English, Leonard Zalman and William E. Cleaver

ABSTRACT: A Schmitt trigger circuit having an arm voltage which automatically increases in amplitude from a fixed minimum value in accordance with the amplitude of the input signal to the circuit. The input signal is applied directly to an inverting input terminal of a differential amplifier and the arm voltage, which comprises a component having a fixed value and a component having a value proportional to the amplitude of the input signal, is applied to a noninverting terminal of the differential amplifier. The output signal of the differential amplifier removes the arm voltage when the instantaneous value of the input signal is greater than that of the arm voltage and thereby causes the voltage at the noninverting terminal to decrease to a value corresponding to the base line value of the input signal.

INVENTOR
JOHN B. SCHWARZ
BY Leonard Zalman
ATTORNEY

SCHMITT TRIGGER CIRCUIT WITH SELF-REGULATED ARM VOLTAGE

A Schmitt trigger is a switching circuit which produces an output signal transition at the time when the input signal supplied thereto has an amplitude equal to its base line value provided, however, that the amplitude of the input signal is decreasing from a value greater than that of a bias voltage termed the "arm" voltage of the trigger. By producing an output signal transition only when the amplitude of the input signal is decreasing from a value greater than arm voltage, output signal transitions are not produced in response to noise on the base line of the input signal as long as the noise level is less than the level of the arm voltage. Generally, a small variation in the value of the arm voltage and its corresponding output transition time are unimportant, but it is highly desirable to determine the crossing time of the base line as accurately as possible.

It is well known that any conventional differential amplifier will function as a Schmitt trigger circuit when a linear feedback signal is supplied to the noninverting terminal of the amplifier. This type of feedback signal is undesirable because it causes the base line value of the input signal to vary in accordance with the high- and low-output levels of the amplifier.

It is often the case that the input signal to a Schmitt trigger circuit has a large variation in steady state amplitude. For this case, the arm voltage value must be set close to the base line value if the trigger circuit is to accept an input signal of small amplitude. However, since the arm voltage is set in conventional Schmitt trigger circuits, including those utilizing a differential amplifier having feedback, input signals of large amplitude have no more protection against base line noise than input signals of small amplitude.

It is an object of the present invention to provide an improved Schmitt trigger circuit.

A further object of the present invention is to provide an improved Schmitt trigger circuit in which measurement of the base line crossing time is uneffected by the level or amplitude of the output signal of the circuit.

Another object of the present invention is to provide an improved Schmitt trigger circuit having additional noise protection for large amplitude input signals without sacrificing the ability to accept small amplitude input signals.

These and other objects of the present invention are achieved by a Schmitt trigger circuit having an arm-voltage-producing network which establishes at a terminal of the circuit, an arm voltage having a value dependent upon the steady state amplitude of the input signal to the circuit. My circuit also uses a nonlinear feedback signal such that measurement of the base-line-crossing time is uneffected by the output signal level or amplitude.

A preferred embodiment of the Schmitt trigger circuit of the invention includes a differential amplifier having two input terminals and an output terminal, a nonlinear feedback network connected between the output terminal and one of the input terminals, and an arm-voltage-producing network coupled between a signal source (which generally provides an amplitude-varying signal) and the one input terminal of the differential amplifier.

For a better understanding of the invention, reference should be had now to the following detailed description of the invention, which is to be read in conjunction with the accompanying drawing in which.

Figure 1:
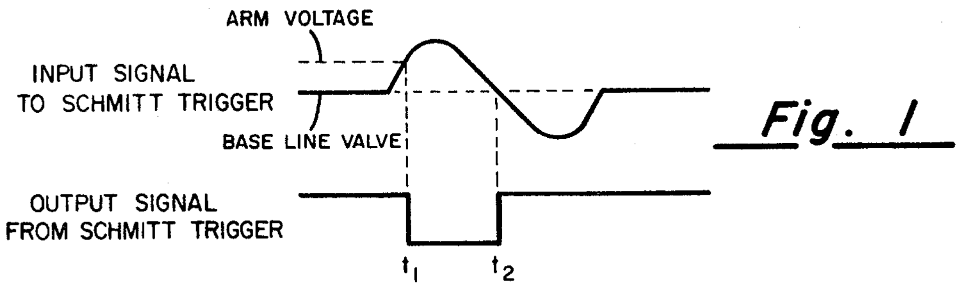
FIG. 1 shows the input signal to and the output signal from a Schmitt trigger circuit.

Referring now to the drawing and more particularly to FIG. 1, a Schmitt trigger circuit produces an output signal transition at time $t_1$ when the input signal to the trigger circuit exceeds the arm voltage of the trigger circuit and at time $t_2$ when the input signal has an amplitude equal to the base line value provided, however, that at the latter time the input signal is decreasing from a value greater than the arm voltage of the trigger circuit. As previously stated, a small variation in time $t_1$ is unimportant, but it is highly desirable to determine time $t_2$ as accurately as possible.

Figure 2:
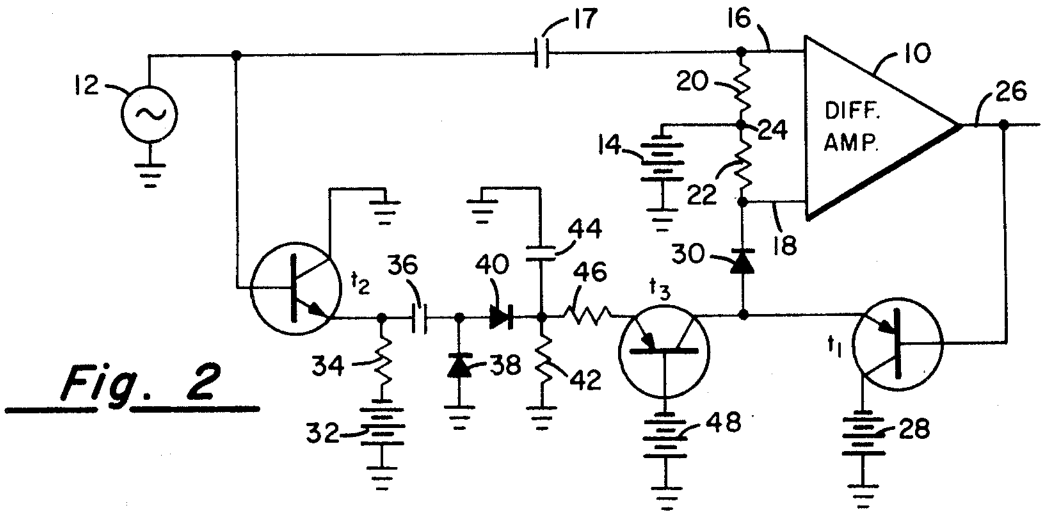
FIG. 2 is a schematic circuit diagram of a preferred form of the Schmitt trigger circuit according to the present invention.

Referring now to the invention, the circuit of FIG. 2 comprises, in brief, a differential amplifier 10 of conventional construction, a source 12, which generally provides an amplitude-varying signal, the base line crossing time of which is to be measured, a source 14 of a constant amplitude bias, on arm-voltage-producing network coupled to amplifier 10 and source 12 for producing an arm voltage at one of the input terminals of amplifier 10, and a feedback circuit including a PNP transistor $t_1$ for removing the arm voltage from the one terminal and substituting the constant amplitude bias therefor when the amplitude of the signal at the other input terminal of amplifier 10 exceeds the amplitude of the arm voltage.

Source 12 is connected to the inverting input terminal 16 of amplifier 10 via a direct-current blocking capacitor 17. Terminal 16 of amplifier 10 is connected to the noninverting terminal 18 of amplifier 10 by serially connected resistors 20 and 22 which are of equal value to provide equal loading of the input circuits of amplifier 10. The negative terminal of source 14, which is chosen to provide a convenient DC operating level for the differential amplifier, is connected to the junction point 24 of resistors 20 and 22.

The output terminal 26 of amplifier 10 is connected directly to the base of transistor $t_1$. The collector of transistor $t_1$ is connected to the negative terminal of a DC source 28 and the emitter of transistor $t_1$ is coupled directly to the anode of a diode 30 which has its cathode connected directly to terminal 18. Transistor $t_1$ and diode 30 supply a nonlinear feedback signal to amplifier 10 thereby making measurement of the base-line-crossing time uneffected by the output signal amplitude of amplifier 10. A nonlinear feedback signal also would be provided if an appropriately poled diode were substituted for transistor $t_1$.

Source 12 is connected also to the base of an NPN transistor $t_2$ which has its emitter connected to the negative terminal of a DC source 32 via a resistor 34, and its collector connected directly to a voltage reference point, for example, ground. This emitter follower transistor configuration prevents loading of source 12. The emitter of transistor $t_2$ is coupled via a capacitor 36 to both the cathode of a diode 38 and the anode of a diode 40. Diode 38, which has its anode connected to the voltage reference point, and capacitor 36 comprise a voltage clamping circuit for the signal supplied to diode 40, that is, they force the most negative point of the signal waveform supplied to diode 40 to be the reference point voltage.

The cathode of diode 40 is coupled to the voltage reference point via both a resistor 42 and a capacitor 44. In addition, the cathode of diode 40 is coupled to the emitter of a PNP transistor $t_3$ via a resistor 46. The base of transistor $t_3$ is connected to the negative terminal of a DC source 48, and the collector of transistor $t_3$ is connected directly to the emitter of transistor $t_1$.

Figure 3:
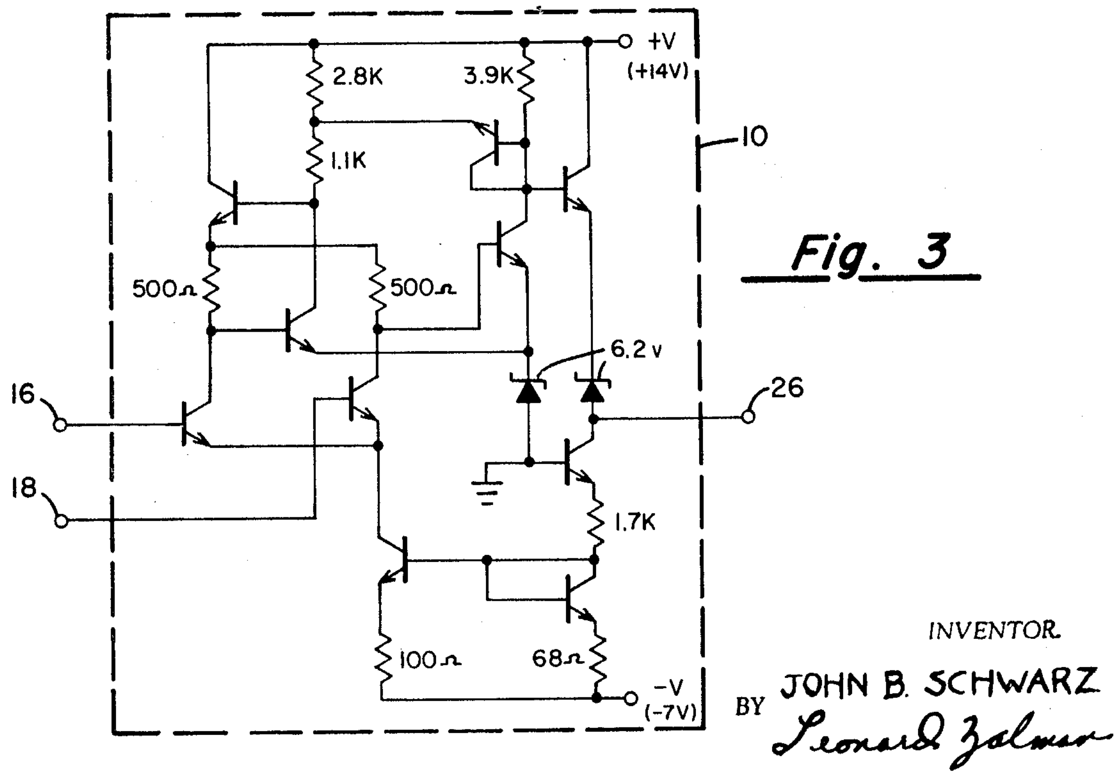
FIG. 3 is a schematic circuit diagram of a component of the circuit of FIG. 2.

Referring now to FIG. 3 there is shown an exemplary circuit of differential amplifier 10 which can be Fairchild linear integrated circuit u4710. Since the circuit of FIG. 3 is of conventional construction, its operation is not discussed. However, it should be noted that when the voltage appearing at terminal 16 of amplifier 10 is lower than the voltage at terminal 18 of amplifier 10 the value of the output signal at terminal 26 of amplifier 10 is high, and when the voltage appearing at terminal 16 of amplifier 10 is higher than the voltage at terminal 18 of amplifier 10 the value of the output signal at terminal 26 of amplifier 10 is low.

Referring again to FIG. 2, in operation, when the condition exists where source 12 does not supply an amplitude-varying signal to terminal 16, a direct current flows from the voltage reference point to source 14, through the path defined by resistors 42 and 46, the emitter-collector path of transistor $t_3$.

diode 30, and resistor 22, to establish at terminal 18 a minimum arm voltage equal to this current times the resistance value of resistor 22. Since, in this condition, terminal 18 has a higher voltage value than terminal 16, the output signal at terminal 26 has a high value and, as a result, transistor $t_1$ is in its nonconducting state.

When source 12 supplies an amplitude-varying signal to terminal 16 and the base of transistor $t_2$, the signal is rectified by diode 40 and this rectified signal charges capacitor 44 to a voltage determined by the peak instantaneous value of the amplitude-varying signal. The charge on capacitor 44 produces an increased current flow through resistors 46 and 22 and hence an increase in the arm voltage at terminal 18, which is directly proportional to the value of the amplitude-varying signal supplied by source 12. The current flow from capacitor 44 will decay at a rate determined primarily by the value of the capacitance and the value of resistor 46. The rate of decay is chosen to be long compared to the time between successive signals from source 12, but short enough to respond to the amplitude variations that occur on a longer time basis. Transistor $t_3$ isolates the rectifying network (diode 40, capacitor 44, and resistors 42 and 46) from resistor 22 and differential amplifier 10 so that the latter will not load down or affect the performance of the former.

When the instantaneous amplitude of the signal from source 12 reaches a value where the voltage at terminal 16 exceeds the voltage at terminal 18, the output signal at terminal 26 switches to a low value, thereby biasing transistor $t_1$ to conduction. Conduction of transistor $t_1$ places the anode of diode 30 at a negative potential relative to source 14 thereby causing diode 30 to cease conduction. With diode 30 not conducting, no current can flow through resistor 22 and hence the voltage at terminal 18 is reduced to the value of source 14, which corresponds to the base line level of the signal from source 12. The output signal of amplifier 10 continues to have a low value until the voltage level at terminal 18 exceeds that at terminal 16 and then the amplitude of the output signal at terminal 26 reverts to the high value, cutting off transistor $t_1$ and once again producing a minimum arm voltage at terminal 18.

From the foregoing, it is apparent that my circuit produces an arm voltage that increases automatically from a fixed minimum value (with no input signal) to a value proportional to the amplitude of the input signal the base line crossing time of which is to be measured. As a result, my circuit provides more noise protection for large amplitude signals than conventional Schmitt trigger circuits without sacrificing the ability to accept small amplitude signals. In addition, by using nonlinear feedback, the base-line-crossing time is uneffected by the output signal amplitude of the circuit.

The components of the circuit shown in FIG. 2 typically may have the following values and may be of the following types:

Capacitor 17—0.033 microfarads
Resistors 20 and 22—200 ohms
Resistor 34—1.1K
Capacitor 36—1.0 microfarads
Resistor 42—1.5K
Capacitor 44—0.027 microfarads
Resistor 46—22 ohms
Source 14—−8 volts
Source 32—−30 volts
Source 48—−2 volts
Source 28—−14.1 volts
Transistors $t_1$ and $t_3$—2N3012
Transistor $t_2$—2N3053
Diodes 30, 38, and 40—1N914

The foregoing values and types are merely exemplary and my invention is not limited thereby. For example, sources 14, 28, 32, and 48 can be replaced by a single source having taps at the desired voltage levels of these sources.

I claim:

1. A self-arming switching circuit comprising:

first means having at least two input terminals and an output terminal for producing in response to an amplitude varying input signal supplied to one input terminal thereof a bilevel output signal having an amplitude transition indicative of a selected amplitude of said input signal, second means coupled to the second input terminal of said first means and supplied with said input signal for establishing at said second terminal a voltage having a value dependent upon the instantaneous amplitude of said input signal, and nonlinear feedback means coupled between said output terminal and said second input terminal of said first means for making said amplitude transition independent of the amplitude of the signal produced at said output terminal of said first means.

2. The circuit of claim 1 wherein said second means includes a device having a unidirectional current conduction characteristic supplied with said input signal for rectifying said input signal, and a capacitor coupled to both said device and said second terminal such that said voltage at said second terminal is made to increase in direct proportion to the amplitude of said input signal.

3. The circuit of claim 2 wherein said first means is a differential amplifier having first and second resistors connected serially across said two input terminals.

4. The circuit of claim 3 wherein said feedback means includes a transistor having its base terminal connected to said output terminal, and a diode connected between another terminal of said transistor and said second input terminal.

5. The circuit of claim 4 wherein said second means further includes a resistor coupling, in part, said capacitor to said diode.

6. A self-arming switching circuit comprising:

first means having at least two input terminals and an output terminal for producing in response to an amplitude-varying input signal supplied to one input terminal thereof a bilevel output signal having an amplitude transition indicative of a selected amplitude of said input signal, second means supplied with said input signal, and coupled to the second input terminal of said first means and including, connected in the order mentioned, an impedance matching network, a voltage clamping network, means for producing a voltage proportional to the instantaneous amplitude of said input signal, an isolation circuit, and a device having a unidirectional current-conducting characteristic, and third means including said device and a transistor connected thereto, said transistor having its base electrode coupled to said output terminal of said first means for making said amplitude transition independent of the amplitude of the signal produced at said output terminal of said first means.